US009398730B2

(12) United States Patent
Gusat et al.

(10) Patent No.: US 9,398,730 B2
(45) Date of Patent: Jul. 19, 2016

(54) FLUID-COOLED ELECTRONIC CIRCUIT DEVICE WITH COOLING FLUID CONDUITS HAVING OPTICAL TRANSMISSION MEDIUM

(71) Applicant: GLOBALFOUNDRIES INC., Grand Cayman (KY)

(72) Inventors: Mircea Gusat, Langnau (CH); Bruno Michel, Zurich (CH); Thomas E Morf, Gross (CH); Sebastien Ragot, Adliswil (CH); Maria Soimu, Langnau (CH)

(73) Assignee: GLOBALFOUNDRIES INC., Grand Cayman (KY)

( * ) Notice: Subject to any disclaimer, the term of this patent is extended or adjusted under 35 U.S.C. 154(b) by 72 days.

(21) Appl. No.: 14/287,249

(22) Filed: May 27, 2014

(65) Prior Publication Data
US 2014/0355983 A1    Dec. 4, 2014

(30) Foreign Application Priority Data
May 28, 2013   (GB) .................................. 1309470.1

(51) Int. Cl.
*H05K 7/20*    (2006.01)
*H04B 10/25*   (2013.01)
(52) U.S. Cl.
CPC ............ *H05K 7/20772* (2013.01); *H04B 10/25* (2013.01)
(58) Field of Classification Search
CPC ..................... F28D 2021/007; H04B 10/25
See application file for complete search history.

(56) References Cited

U.S. PATENT DOCUMENTS

| 3,878,397 | A  | * | 4/1975 | Robb ................... | G02B 6/4201 |
| | | | | | 250/227.24 |
| 5,525,190 | A  |   | 6/1996 | Wojnarowski et al. | |
| 8,019,187 | B1 |   | 9/2011 | Dutta | |
| 8,351,206 | B2 |   | 1/2013 | Campbell et al. | |
| 2006/0196651 | A1 | * | 9/2006 | Board ..................... | F28D 15/02 |
| | | | | | 165/177 |
| 2007/0023904 | A1 |   | 2/2007 | Salmon | |
| 2008/0144823 | A1 | * | 6/2008 | Abe ....................... | H04B 10/70 |
| | | | | | 380/256 |
| 2008/0239672 | A1 |   | 10/2008 | Ghoshal et al. | |
| 2009/0162018 | A1 | * | 6/2009 | Hayase ................. | G02B 6/421 |
| | | | | | 385/94 |
| 2009/0251862 | A1 |   | 10/2009 | Knickerbocker et al. | |

(Continued)

FOREIGN PATENT DOCUMENTS

CN           10147436         7/2009
CN           101779395 A      7/2010

OTHER PUBLICATIONS

Khan et al., 3-D Packaging with Through-Silicon via (TSV) for Electrical and Fluidic Interconnections, IEEE Transactins on Components Packaging and Manufacturing, Jan. 14, 2013.

*Primary Examiner* — Nathan Curs
(74) *Attorney, Agent, or Firm* — Scully Scott Murphy and Presser

(57) ABSTRACT

An electronic circuit device, including a combined optical transmission and cooling fluid conduit network. The network includes at least one cooling conduit having an optical transmission medium. The network is configured to convey a cooling fluid via the at least one cooling conduit and to convey an electromagnetic signal via the optical transmission medium. The network is in thermal communication with a first set of one or more components of the electronic circuit device and in signal communication with a second set of one or more components of the electronic circuit device. The first set and second set of components are at least partly overlapping. A method for conveying optical signal in such an electronic circuit device is also provided.

16 Claims, 9 Drawing Sheets

(56) References Cited

U.S. PATENT DOCUMENTS

| | | | | |
|---|---|---|---|---|
| 2010/0111525 A1* | 5/2010 | Ford | ............. | H04J 14/00 398/43 |
| 2012/0300402 A1 | 11/2012 | Vos | | |
| 2013/0020707 A1 | 1/2013 | Or-Bachl et al. | | |
| 2014/0355204 A1* | 12/2014 | Gusat | ............. | H05K 7/20763 361/679.53 |

\* cited by examiner

FLUID-COOLED ELECTRONIC CIRCUIT DEVICE WITH COOLING FLUID CONDUITS HAVING OPTICAL TRANSMISSION MEDIUM

CROSS-REFERENCE TO RELATED APPLICATION

This application claims priority under 35 U.S.C. §119 from United Kingdom Patent Application No. 1309470.1 filed May 28, 2013, the entire contents of which are incorporated herein by reference.

BACKGROUND OF THE INVENTION

1. Field of the Invention

The invention relates in general to the field of in-pipeline fluid-cooled electronic circuit devices, especially fluid-cooled computer system components.

2. Description of Related Art

Current server, datacenter and High Performance Computing (or HPC) subsystems are composed of tens to hundreds of densely packed blades, assembled per chassis, rack and point of delivery (PoD, i.e., a container-sized server cluster). Packaging density and PoD sizes are increasing the stress on the input/output (IO) scalability, whether electrical or optical.

Recent multicore CPUs (central processing units), faster higher density memory and IO busses, virtualization, multiple gigabit Ethernet interfaces integrated on-chip all have exposed the gap between the increasing communication demands and the limited pin IO capabilities of packaging. For instance, chip multiprocessors (CMPs) attempt to maximize the performance and more efficiently use the increasing silicon area, also benefiting from new 3D stacking packages. However, their achievable memory-level parallelism (MLP) is IO-limited for online transaction processing (OLTP), business analytics, Partition-Aggregate, Hadoop etc., datacenter workloads, as well as for HPC and media/streaming applications that are bandwidth-bound. Lacking sufficient IO bandwidth, CMPs must often settle for a fraction of their achievable MLP, which increases the practical difference between peak and sustained performance, typically a fraction of the former.

More generally, recent evolutions in the IO pin density has led to substantially increased wiring/interconnect densities. The increased density has raised new thermal engineering challenges, addressed by liquid, instead of the current air cooling that is both insufficient for the upcoming energy densities, and inefficient with respect to datacenter PUE factors. Recent announcements indicates that at least some of the next generation's large systems will be liquid-cooled, using water, oil and/or other convenient thermal agents, e.g., by external dunking of boards, blades, chassis, racks in appropriately sized vats filled with clear oil, circulated by large pumps, as proposed by Intel.

SUMMARY OF THE INVENTION

The present invention provides an electronic circuit device, including a combined optical transmission and cooling fluid conduit network, wherein the network includes at least one cooling conduit that includes an optical transmission medium, the network configured to convey: a cooling fluid via the at least one cooling conduit, the network being in thermal communication with a first set of one or more components of the electronic circuit device; and an electromagnetic signal via the optical transmission medium, the network being in signal communication with a second set of one or more components of the electronic circuit device, the first set and second set of components at least partly overlapping.

The present invention also provides a method for conveying optical signal in an electronic circuit device that has a first set and a second set of components, the method includes the steps of: injecting optical signal in an optical transmission medium of at least one conduit to convey optical signal therein; and collecting optical signal conveyed in the optical transmission medium.

BRIEF DESCRIPTION OF THE DRAWINGS

In FIG. 1A, the combined conduit network has multiple cooling conduits in a tree-like arrangement, whereas in FIG. 1B, the combined conduit network includes one cooling conduit in a single-loop;

FIGS. 2B-2D respectively depict: a star network configuration; a ring topology; and a mesh configuration, wherein all components are optically connected two-by-two;

DETAILED DESCRIPTION OF THE PREFERRED EMBODIMENTS

Figure 1A:
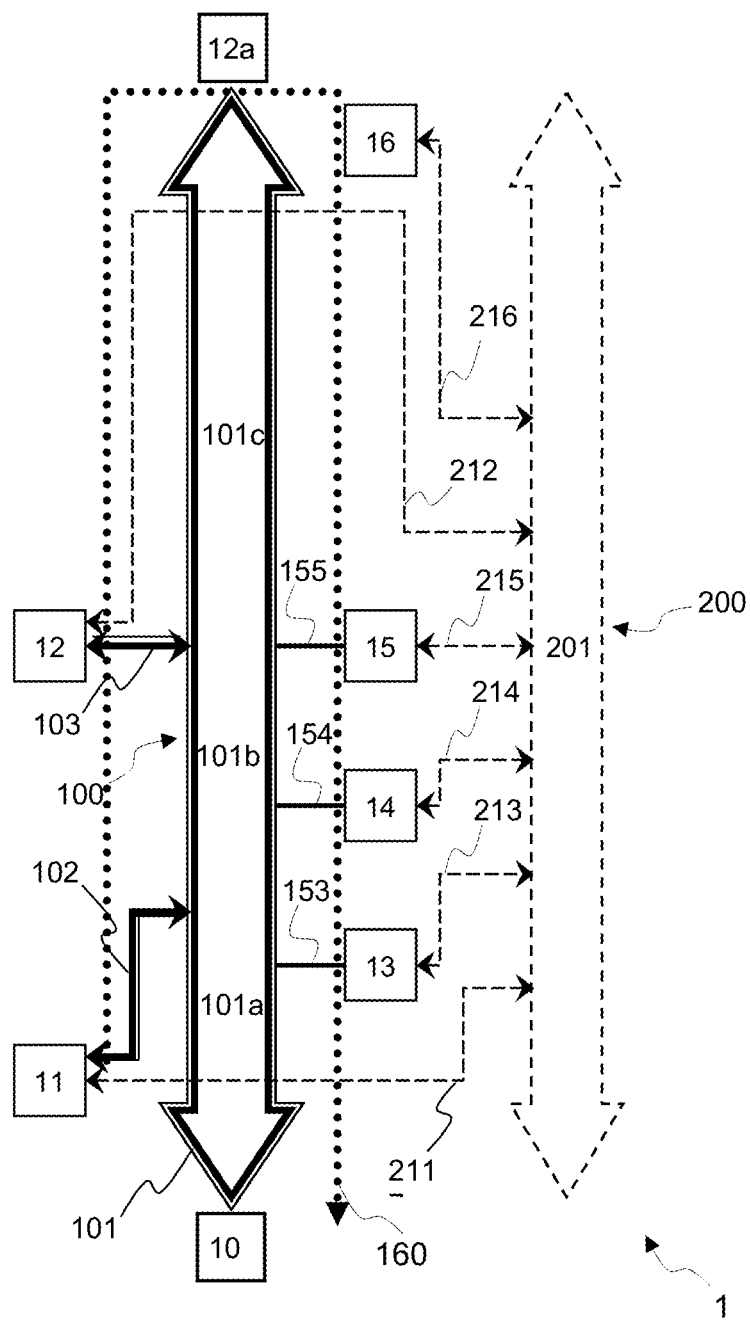
FIGS. 1A-1B are block diagrams schematically illustrating components of a computer system that includes a combined optical transmission and cooling fluid conduit network, wherein conduits include optical transmission medium and optical connections are partly mapped onto the combined network, according to embodiments.

This invention initially aimed at addressing the chip- and package-level IO pin bottleneck expected for future servers, storage, networking, business appliances and High Performance Computing systems (or HPC) systems. Multitenant virtualized datacenter and the so-called big data/HPC workloads, combined with advanced silicon packaging exacerbate this problem. The solution that present inventors devised is not only suited for application to such systems, but it can more generally be applied to any in-pipeline fluid-cooled electronic circuit devices or systems.

Indeed, as a variant to external dunking, cooling solutions relying on in-pipeline circulation schemes are considered here. In-pipeline circulation cooling can use a relatively large copper conduit (also referred to as "plumbing"), e.g., adopting a "ring of trees" topology, for the fluid that is pumped across all the critical/hot components: CPU, GPU, DRAM, IO Bridge, etc. Such a cooler includes pipes that guide the coolant onto an electronic circuit device, e.g., a compute board, typically via a single inlet tube from where pipes branch to serve different components with smaller tubes and are collected again to a single outlet tube. The tubes are built such that they connect heat dissipating and data generating/consuming components to the cooling loop. External dunking and in-pipeline cooling schemes involve a number of different technical considerations (e.g., concerning the cooling liquid, fluid volumes, debit/circulation intensity, its optimal working temperature, direct access to the silicon die (in-pipe), or indirectly thru the package (dunking), cooling efficiency, etc.).

Now, one may realize that the critical components are the same silicon components exposed to the IO bottlenecks discussed in introduction. Having observed this, present inventors have explored the following question: can the same cooling conduit be re-used also for signal transmission? Their answer is positive, provided that optical signal communication is relied upon. Indeed, electrical buses become increasingly difficult at high data rates (merely due to increasing losses, cross-talk and frequency resonant effects), whereas optical transmissions shows much less losses, is power efficient and not plagued by frequency resonant effects. Furthermore, the choice of optical transmission appears to be promising for 3D stacking and packaging, as '3D' optical paths can match the cooling paths.

Accordingly, and in reference to FIGS. 1 to 8, a general aspect of the invention concerns an electronic circuit device 1, such as a computer system, chip, module, board or rack, etc. Innovative aspects of such a device revolve first and foremost around a combined optical transmission and cooling fluid conduit network 100, wherein optical communication paths are at least partly mapped onto the cooling conduit topology.

This network 100 involves at least one (but typically more) cooling conduit 101-103, each of which includes some optical transmission medium 60, e.g., integral therewith. The optical medium 60 typically includes: fibers, bundles or ribbons of fibers, e.g., ribbon flexes. At least some parts or portions of the optical transmission medium 60 can be secured (be it directly or not) to the conduits, in close proximity therewith. One possibility is to have for instance portions of the optical transmission medium 60 covering (inner or outer) walls of the cooling conduits. Another, simpler possibility consists of freely deploying optical transmission medium within the conduits, as to be discussed later in detail.

By "combined optical transmission and cooling fluid conduit network", it is meant a system having hybrid conduits (including optical medium) that optically connects to or interconnects components of the electronic circuit 1 and are in thermal communication therewith. Still, the network 100 can include additional conduits that are cooling conduits only (not equipped with optical transmission medium). It can also include additional optical transmission medium (beyond the medium 60) that is not mapped onto the conduit topology. This network 100 is often referred to as "hybrid network" or "combined network" herein, for short. Said components can be (inter)connected via only one or several hybrid conduit(s). Thanks to such hybrid conduits (also referred to as "cooling conduits" or simply "conduits"), the hybrid network 100 can convey: (i) a cooling fluid 50 through such conduits, to cool components of the device 1, and (ii) an electromagnetic signal 70 via the optical transmission medium that such conduits include, to ensure signal communication to/from/between such components.

As said, not all the cooling conduits that the network 100 can include need be equipped with optical transmission medium. Optical connections can thus only partly map onto the cooling conduit topology of the network 100. The hybrid network 100 is accordingly said to be in thermal communication with a first set of (one or more) components 11-15 of the device 1 and in signal communication with a second set of (one or more) components 10-12a of the device 1. The second set can differ from the first set but the first and second sets of components at least partly overlap.

Figure 1B:
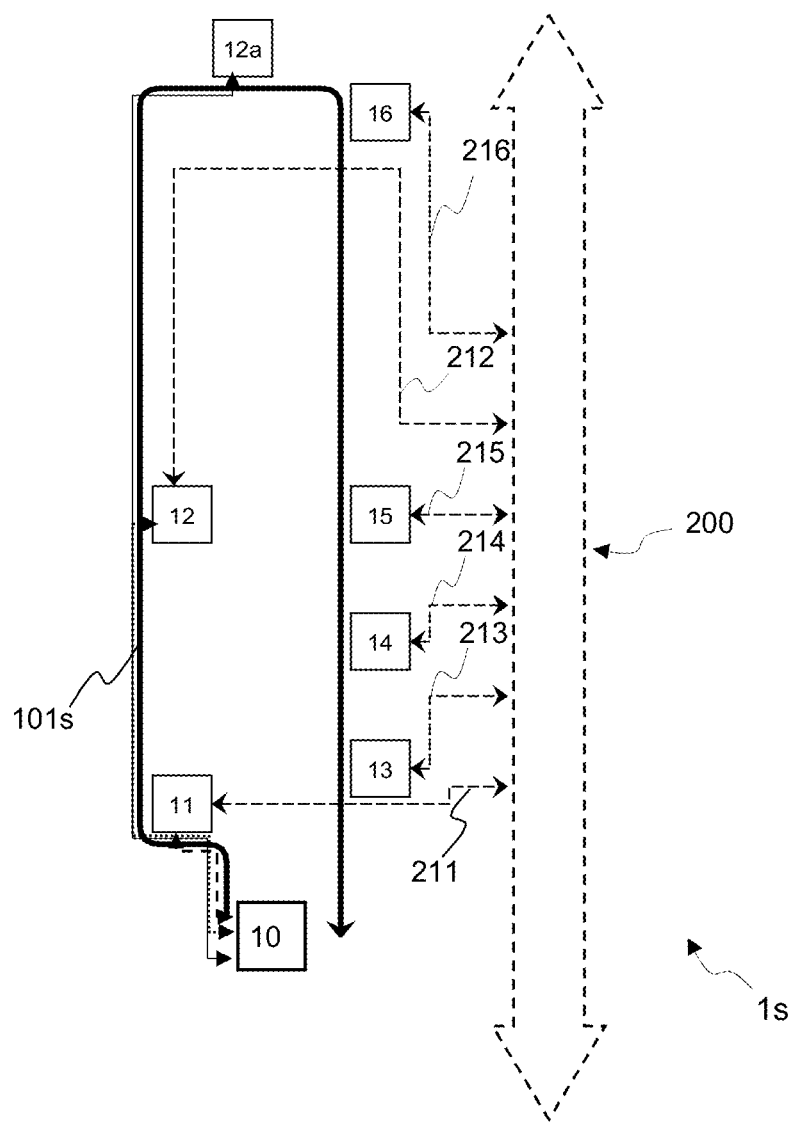

Only one hybrid conduit 101s can actually suffice to thermally connect each component of the first set, in a single-loop configuration, as for instance illustrated in FIG. 1B. Various optical connection schemes can be mapped onto the cooling conduit 101s, as it can be realized. However, most embodiments described below assume tree-like conduit arrangements, as illustrated in e.g., FIGS. 1A and 3A. Such tree-like arrangements, though more complex than single-loop arrangements, allow for more easily matching the arrangement of the components of the device 1 and thus for more flexibility in the placement of these components (driven by numerous other constraints).

The present solutions addresses the chip- and package-level IO pin bottleneck of future servers, storage, networking, business appliances, HPC systems and more generally in-pipeline fluid-cooled electronic circuit devices consuming data. Since a cooling conduit network can generally be configured to cool all important components, providing optical connections mapped onto this network makes it possible to convey optical signal encoding data, e.g., IO channels, without requiring substantial additional space (possibly no extra space at all), while markedly improving the communication capacity compared to usual electrical buses.

The first set of components 11-15 can include: a processor (CPU, GPU, or more generally any computer chip or the like); an optical switch, hub, router, splitter, etc. (or a processor configured as such); a memory element (e.g., a DRAM, SDRAM, DIMM); a IO Bridge, and/or more generally any component that consumes power and therefore needs to be cooled down (e.g., IO Bridge), in operation. In fact, one understands that any or each of these components could even be a system on a chip, a computer, a cluster of computers, a rack filled with analog devices (DSPs), etc., i.e., any usual component of an electronic circuit device, apparatus or system. The second set of components 10-12a can include the same types of components and/or more generally any component that consumes and/or produces data, signals, etc., and which therefore needs to be provided with input signal, and/or from which output signal need be collected. As touched above, the first and second sets shall at least partly overlap. However, the second set of components 10-12a typically is a subset of the first set 11-16, as illustrated in FIG. 1A, since there are generally more components that need to be cooled than component that consume/produce signal. Still, the two sets could be identical. Even, the second set could in principle be larger than the first set.

Figure 2A:
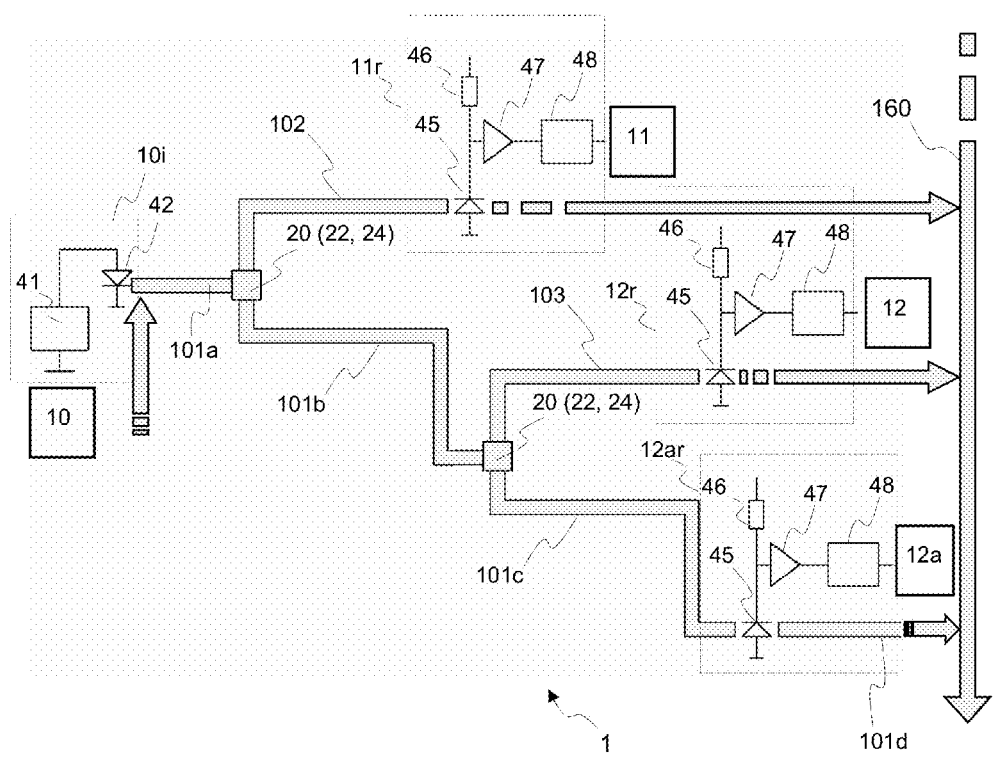
FIG. 2A schematically illustrates devices for injecting and collecting optical signal in tree-like cooling arrangement similar to FIG. 1A, as in embodiments.
Figure 4:
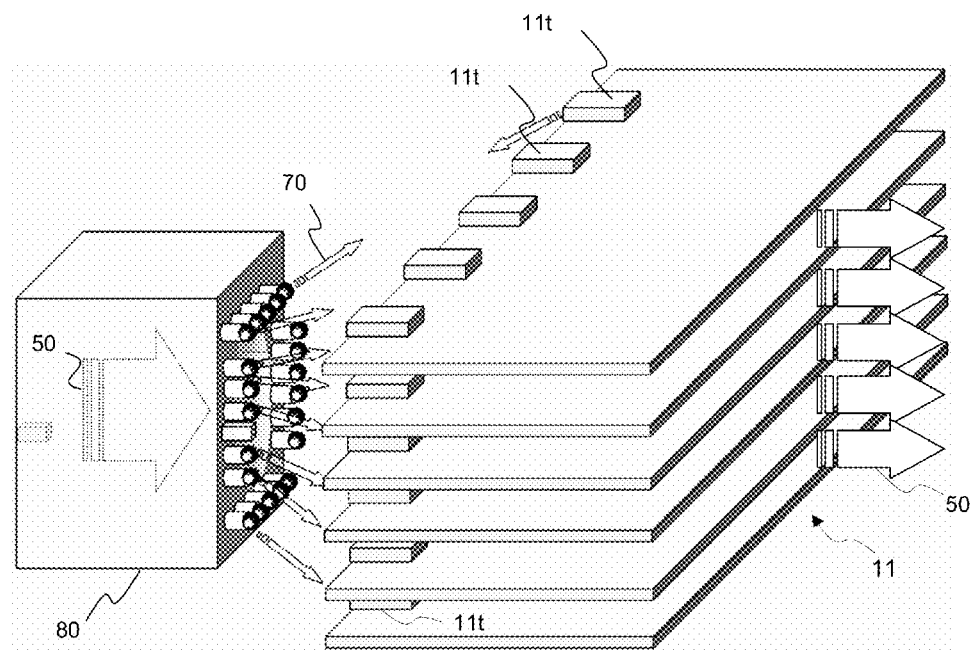
FIG. 4 is a 3D view of a simplified representation of the adapter of FIG. 3, arranged in the vicinity of a 3D chip, to optically and thermally connect to this chip, as involved in embodiments.

"Signal communication" implies elements, such as optical transceivers (or receivers, transmitters, etc.), that make it possible for the components 10-12a of the device 1 to inject/collect data in the network 100, which data are conveyed as a signal, notably through the optical transmission medium 60. Thus, "signal communication" in the present context involves optical communication. Yet, electrical-to-optical and optical-to-electrical conversion is involved at some point, e.g., before or during signal injection into the network 100 and after or during signal extraction, e.g., for use by the components 10-12a. How to integrate optical transceivers and injecting/collecting data via such transceivers is generally known per se, e.g., in silicon photonics. Such transceivers, receivers, transmitters can be regarded as forming part of the components 10-12a, or not. They can also be regarded as intermediate, distinct elements located between the network 100 and components 10-12a. In the latter case, the signal injection/collection points shall be distributed along the hybrid conduits, or in the vicinity thereof, to allow for the network 100 to be in signal communication with components 10-12a of the second set, as illustrated in FIG. 2A. In the former case, signal injection/collection devices can be provided integral with, i.e., directly on or in the components 10-12a of the second set, as illustrated in FIG. 4.

Note that signal injection/collection devices could possibly be mounted and coupled to the components 10-12a and network 100 at a final stage of the fabrication process, or even be designed as removable parts, that can be clipped in a corresponding housing in the device 1, allowing for more flexibility and customization. Moreover, the device 1 can be designed to operate in conjunction with external injection units. Thus, the device 1 may not necessarily include such signal injection/collection devices when delivered to customers (e.g., in consumer or low end devices).

The present solutions can be implemented for any type of signal communications, data, clock, digital or analog. They are, however, preferably used to convey IO channels: IO signals are conveyed optically through the optical transmission medium 60 and can be logically organized as data-/address-/busses, etc. Since IO channels require several individual optical channels, the optical transmission medium 60 preferably includes: multiple fibers (in bundles), ribbon of fibers, or ribbon flexes, as evoked above. It is hereafter mostly assumed that signals conveyed are IO channels.

"Thermal communication" means that conduits are arranged so as to make it possible to cool down the device's components, in operation. The cooling can involve any one of, but likely several of conduction, convection, radiation, or more generally, any type of contact or non-contact thermal exchange, which again is known per se, in the field of in-pipeline fluid-cooled electronic circuit devices.

The hybrid network 100 and the component arrangement and/or configuration can, each, be 2D, 2.5D or 3D. The conduit network can extend beyond i.e., is not limited to, the confines of a chip, or more generally a module, a board or a rack of the device 1.

Note that the presence of the hybrid network 100 does not exclude an additional electrical bus network 200 (dashed lines and contours in FIG. 1A or 1B). On the contrary, a usual electrical bus network 200, i.e., an electrical input/output channel transmission medium, is preferably provided, which can for instance serve dual components 11, 12 otherwise coupled to optical medium 60 in the hybrid network 100, as discussed below. Other components can be served by the electrical bus 200 and by cooling conduits e.g., components 13-16 in FIG. 1A, but are not optically connected. More generally, various network topologies can be contemplated for the combined network 100, ranging from a single loop conduit 101s (FIG. 1B) having optical transmission medium therewith and shaped such as to serve various destinations 10-16, to more sophisticated, e.g., tree-like topologies, involving junctions 20, possibly signal routing, splitting, etc. such as illustrated in FIGS. 1A, 2A-D, and 6.

For instance, FIG. 1A shows a combined network 100 having different types of conduits: the hybrid conduits 101a-c, 102, 103 (identified by asymmetric double lines) include, each, optical transmission medium, e.g., integral therewith, whereas conduits 154-156 are cooling conduits only (single line). The arrangements of both sets of conduits evoke tree-like structures. The subset of (hybrid) conduits 101-103 allows for the combined network 100 to reach components 10-12a of the device 1 and thus, for both signal and thermal communications with such components 10-12a. The subset of conduits 153-155 and 160 allows for cooling (only) the components 13-16, which are otherwise connected to the electrical bus 200, via respective connections 213-216. For completeness, conduits 101c, 102, 103 and 154-156 are, each, in fluid communication with one or more conduit 160 to close the cooling liquid loop. In FIG. 1A, liquid inlet is injected via conduit 101a (liquid inlet is not shown, assumed to be upstream conduit 101a and possibly external to the device 1) and collected via the conduit 160 (liquid outlet is not shown, assumed downstream the conduit 160).

Components of the device 1 can be connected to one or each of the hybrid network 100 and the electrical 200. Thus, at least some of the components 11, 12 served by the combined network 100 (i.e., components of the "second set"), can have a dual input/output interface, such as dual IO chips. Such dual components 11, 12 can therefore be optically connected to the optical transmission medium 60 of the combined network 100 (via optical medium of conduits 102-103) and electrically connected to the electrical bus 200 (via connections 211, 212). In this regard, dual IO chips can have a classical pin or optical IO interface via BGA, pins, etc. on the package's bottom, in addition to the 'edge of the 3D stack chip' optical IO connectivity as proposed in embodiments (see e.g., FIG. 4).

As mentioned above, the device 1s of FIG. 1B is a single-loop variant to FIG. 1A, i.e., the hybrid network 100 includes one cooling conduit 101s configured in a single-loop. The conduit 101s is shaped such as to thermally connect all desired components 10-16. Still, optical connections are provided to optically connect components 10-12a, which partly map onto the conduit shape 101s. Optical connections are depicted by double arrows. In this example, component 10 occupies a central position, in a star network fashion (it could e.g., be an optical switch or any component configured as such) and individually connects each of the components 11, 12, 12a (dashed, dotted, full line double arrows, respectively). Still, components 10-12a can be connected according to other configurations, as evoked below in reference to FIGS. 2B-D.

Referring now to FIGS. 3-6, 7B, 7D, 7F, 8A and 8B altogether, a first class of embodiments is now described which involves hybrid conduits, wherein optical transmission medium 60 is arranged within the conduits.

Figures 7A, 7B:
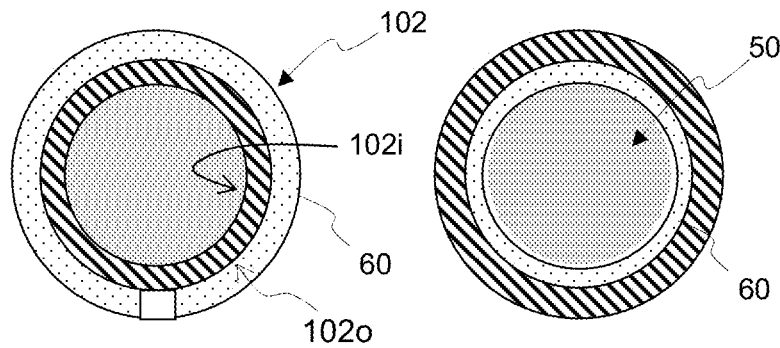
FIGS. 7A-7F schematically illustrates possible cross-sections of cooling conduits having a flat optical transmission medium such as an optical fiber ribbon integral therewith or freely deployed therein, as involved in embodiments.
Figures 7C, 7D:
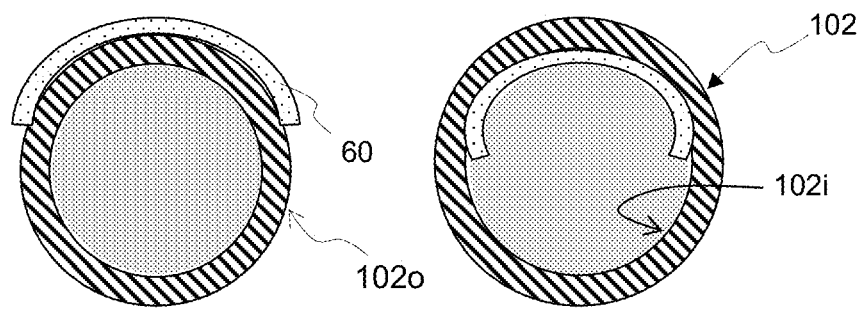
Figure 8A:
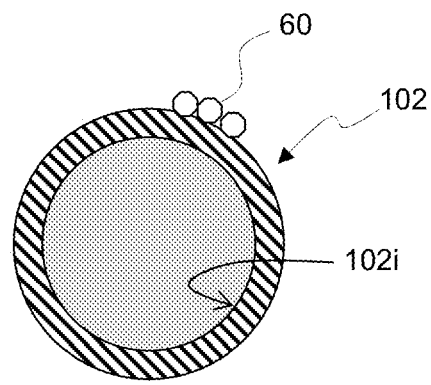
FIGS. 8A-8C schematically illustrates possible cross-sections of cooling conduits having optical transmission medium such as optical fibers or fiber bundles integral therewith or freely deployed therein, as involved in embodiments.
Figure 8B:
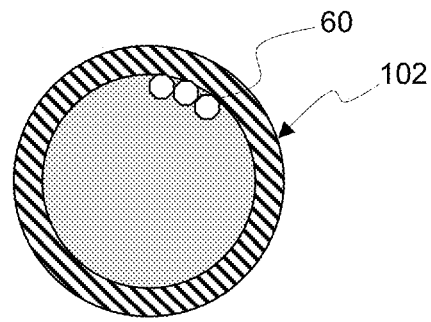
Figure 8C:
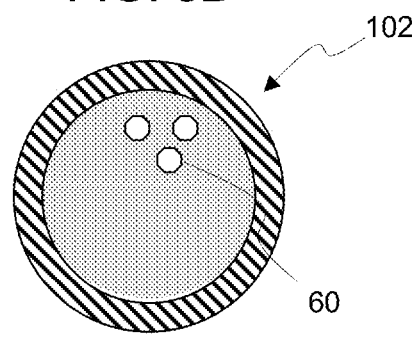

One possibility is to have an inner wall 102i of a conduit 102 (or at least part of the inner wall) covered by (at least part) of the optical transmission medium 60, as illustrated in FIGS. 7B, 7D (where a ribbon 60 of fibers is used to convey data), or FIGS. 8B, 8C (where fibers or fiber bundles, e.g., having a compact radial arrangement, are assumed). The inner walls can be cladded, coated or more generally covered by the optical transmission medium 60, in whole or in part. The medium 60 accordingly extends within the conduit but somehow conforms to the inner wall shape, such as to minimally perturb the cooling liquid flow therein. This solution, however, requires substantial fabrication process, to fix the medium 60 against inner walls 102i.

Figures 7E, 7F:
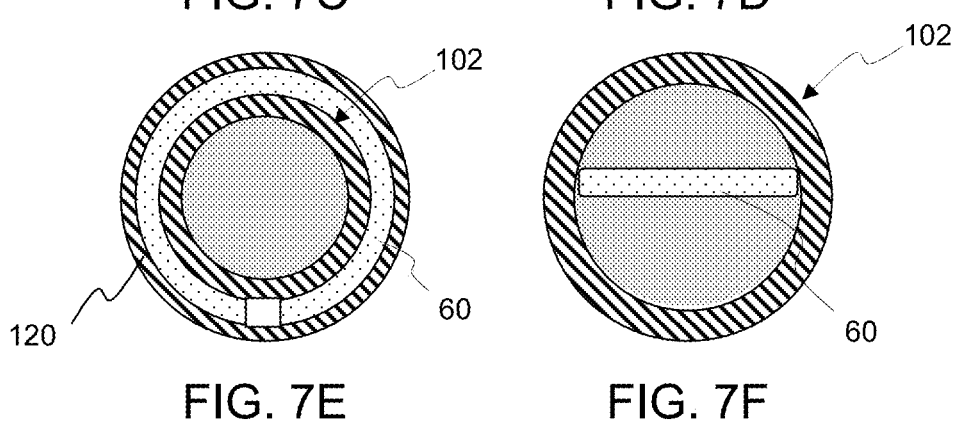

In preferred variants, the optical medium 60 can be deployed and essentially freely extends within a conduit, as illustrated in FIGS. 7F and 8C. In FIG. 7F, a ribbon extends flat in the middle of the conduit 102. In FIG. 8C, fibers or fiber bundles are freely deployed. Only small portions of the medium could be fixed to the conduits (nut not necessarily within the conduit), or to an adapter 80, 80a (see FIGS. 3-5), or still a valve. Fibers/bundles can penetrate into a conduit via any watertight orifice. One can thus deploy the optical transmission medium e.g., a flat ribbon or flex, or still fibers/fiber bundles within the conduit without covering inner walls or fixing the medium 60 thereto. This type of solutions is much simpler in terms of fabrication. The ratio of the cross-sectional dimension of the medium 60 to the inner conduit diameter is typically very small, such that the cooling liquid flow is not measurably disturbed.

Other, e.g., intermediate configurations can be contemplated, e.g., combining aspects of the two variants above. Namely, portions of the medium 60 could cover inner walls of the conduits, while other portions are freely deployed in-conduit.

A second class of embodiments is now discussed in reference to FIGS. 7A, 7C, 7E and 8A, where an outer wall 102o of a conduit 102 is covered (in whole or in part) by optical transmission medium 60. More generally, the optical medium 60 can be mapped external to the cooling pipeline, yet integral therewith. Covering the external conduit walls is easier than covering inner walls, in terms of fabrication. Suitable adhesives or fixing means could be used to that aim. Experience gained in silicon photonics can be advantageously used for fabrication. This type of solution can require additional clearance space compared to in-conduit solutions, and is more sensitive to radiation, EM fields, mechanical damage at assembly time, and to tampering, compared to in-pipe solutions.

Now, depending on the precise physical and chemical context of the device 1, the medium 60 externally mapped may need to be isolated or protected. Thus, a conduit, whose outer wall is covered by the optical medium 60, can be inserted within another conduit 120 (FIG. 7E).

The appended drawings are not to scale. To fix ideas: the cross-sectional dimension of the optical medium 60 (e.g., the thickness for flat media 60 or diameter for fibers), shall typically be chosen to be less than 500 m, preferably less than 250 m and more preferably less than 130 m. For comparison, an inner section diameter of a cooling conduit shall typically be chosen to be less than 20 000 m, yet less than 5 000 m for most applications and more preferably less than 3 000 m. The ratio of this the cross-sectional dimension to the inner section diameter of a conduit is ideally as small as possible, to not significantly perturb the cooling liquid flow, e.g., less than 0.13 on average. Somewhat better results are obtained if this ratio becomes less than 0.07. Under 0.02, the perturbation is typically not detectable anymore.

Several methods of fabrication can be contemplated. An important aspect is the fabrication of cooling conduits that include optical transmission medium 60, e.g., integral therewith. Most generally, fabrication methods shall involve inserting optical transmission medium within a conduit; and/or covering at least part of an inner wall 102i and/or an outer wall 102o of a conduit 102 with at least part of the optical transmission medium 60.

Consider for instance an implementation that makes use of flat ribbons, bent to coat an inner wall of the conduit (FIGS. 7B and D), e.g., a copper pipe: This can be fabricated by pulling ribbons within conduits; injecting a pressurized fluid to urge and clad the medium 60 against the inner wall 102i. The inner wall and/or the ribbon can be coated with some suitable drying adhesive to that aim. For fixing fiber/bundles, similar techniques can be used. Yet, fibers and fiber bundles are simpler to deploy and fix as they can be inserted at any input point into a conduit and extracted at any output point via orifices that are easily sealed afterward. Tapping mechanism could furthermore be used. In addition, the medium 60 could be tensioned in a conduit before cladding. If necessary, portions of optical medium 60 can be connected or split, etc., outside the conduits and then pulled and fixed within conduits before mechanically connecting the conduit segments and conduit junctions.

Experience gained in the fields of optical fibers/fiber ribbon, ribbon flexes, as well as in endoscopy and stents (e.g., coronary stents) can advantageously be used to refine or develop suitable fabrication techniques. A simple example of fabrication is the following: a leading flexible wire is endoscopically inserted along the desired sections of the conduit, to which a 'puller' device can be attached. Using the puller device, the ribbon or fiber bundle is pulled in reverse direction through the conduit, and cut to dimensions. Finally, the transceivers or optical terminators are attached using any suitable technology.

Referring now more particularly to FIGS. 2A and 4: the device 1 can include optical signal injection units 10i, 11t, i.e., units configured to inject optical signal 70 in optical medium 60. The device can correspondingly include optical receivers 11r, 11t, 12r, to collect optical signal 70 conveyed along the optical medium 60, e.g., for subsequent use by respective components 10-12a. Note that the device 1 could be designed to cooperate with external signal injection/collection units, i.e., outside the device 1. Injection/collection units can be located in the vicinity of the hybrid network 100 (as assumed in FIG. 2A), and/or directly in components 10-12a served by the network 100 (see FIG. 4). Still, injection units and receivers can be part of a transceiver 11t, or a transmitter-receiver element. In FIG. 4, elements 11t are, each, a transceiver for receiving and/or transmitting optical signal 70. Similarly, although not shown in FIG. 2A for clarity, each component 10-12a is preferably associated to both an injection unit and a receiver.

As touched earlier, the combined network 100 can have a tree-like structure, e.g., a ring of tree topology, as assumed in FIG. 1A or 2A. To achieve this, one can use one or more conduit junctions 20, possibly in association with optical splitters 22, preferably with some amplifiers 24 too. In the example of FIG. 2A, conduit 101 is located upstream a first junction 20. Downstream this junction 20 are two conduits 102, 101b (conduit part 101b is part of a main path 101, similar to FIG. 1A), allowing for reaching at least two components 11-12a downstream. Each of the upstream and downstream conduits is a hybrid conduit, i.e., including some optical transmission medium, e.g., integral therewith (not shown for clarity).

Since at a junction 20, an upstream conduit splits into two downstream conduits, an optical transmission medium splitter (such as a fiber splitter) can be provided at the level of such a junction 20, suitably coupled to upstream and downstream medium to split optical signal. Such optical transmission medium splitters are known per se. Also known are methods to suitably connect optical transmission media to splitters. Beyond splitters, the device 1 can more generally be configured to switch, route, buffer, and/or amplify the IO channels to extend and/or distribute to/from multiple inputs and outputs, similar to optical switch systems, to which the reader is referred.

As evoked earlier, components 10, 11, 12, 12a of FIG. 2A can include one or more of the following:
- an input/output IO bridge device;
- a memory integrated circuit such as a DRAM, a DIMM, etc.;
- a processor, preferably a central processing unit, a 3D chip, etc.; and
- an optical switch, hub, router, etc., or an electronic circuit component configured as such, or still a splitter such as a fiber splitter.

As further illustrated in FIG. 2A, an optical signal injection unit 10i can possibly include both a data transmitter 41 and a light emitting device such as a laser device 42, e.g., a VECSL. The data transmitter 41 is coupled to the laser device 42, which itself is coupled to the optical transmission medium (integral with cooling conduit 102), to enable optical signal injection in the hybrid network 100. The optical signal injection unit 10i is associated to component 10 of the device 1, in the example of FIG. 2A.

Correspondingly, an optical receiver 11r, 12r can include a photodetector (which preferably is a photodiode 45) and a digital signal restoration unit 48, which preferably is coupled to an amplifier 47. The photodetector is coupled to the digital signal restoration unit 48 to restore digital signal from optical signal conveyed in the optical medium of conduit 101. The photodetector is typically a photodiode coupled to a diode bias.

For completeness, the embodiment of FIG. 2 involves:
- A data transmitter 41;
- A Laser device e.g., VCSEL 42, which together with transmitter 41 forms an injection unit 10i, associated to component 10, which can further be connected to a receiver (not shown);
- Junctions 20, e.g., including a fiber splitter 22 and an amplifier 24;
- Cooling conduits or conduit parts 101a-d, 102, 103, each including optical transmission medium (e.g., a ribbon flex or optical fibers, not shown). Any conduit like conduit 102 can actually be several conduit parts, assembled in series, see FIG. 3, possibly with adapters as in FIG. 3, 4 or 5 to optically connect to receivers 11r, 12r, 12ar, and thus enable signal communication with components 11, 12, and 12a, respectively;
- Three sets of optical receivers 11r, 12r, 12ar, enabling connection to components 11, 12, and 12a, respectively, each of said sets including:
- A photo diode 45;
- A diode bias 46;
- A transimpedance amplifier 47; and
- A digital signal restoration unit 48, which together with elements 45-47 can be regarded as forming part of a receiver. A restored digital signal is obtained in output of unit 48.

Figure 2B:
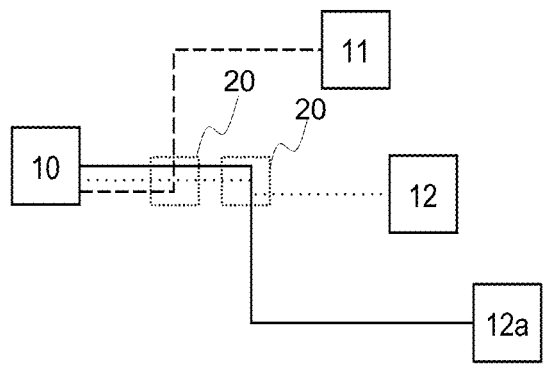
FIGS. 2B-2D schematically illustrate various ways of optically connecting components via a hybrid network 100, wherein optical connections are partly mapped onto the cooling conduit network topology of FIG. 2A, as in embodiments.
Figure 2C:
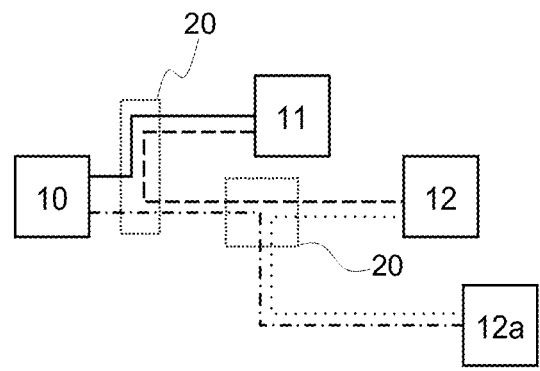
Figure 2D:
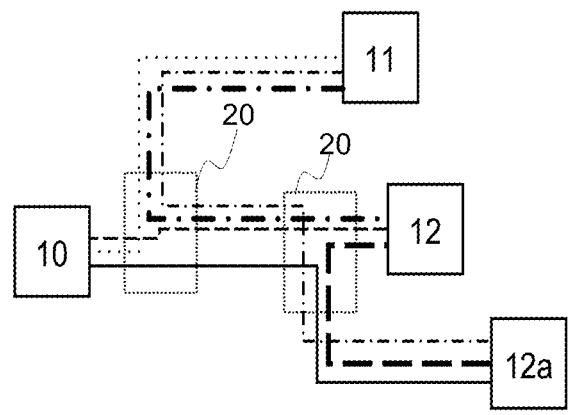

Just like in FIG. 1A, components 10-12a of FIG. 2A form a network of components that are connected via the hybrid conduit network 100. A first subset of these components can be set in signal communication with a second subset of these components, thanks to optical medium 60 that the hybrid conduits include. As schematically illustrated in FIGS. 2B-D, there are various possible ways of optically connecting these components, wherein optical connections can still be mapped (at least partly) onto the cooling conduit network topology. FIGS. 2B-D respectively depict: a star network configuration; a ring topology; and a mesh configuration. Optical connections are illustrated using various patterns (plain lines, dashed, dotted, dotted-dashed, etc.). Conduits are not represented, for clarity: only the junctions 20 are depicted, the topologies being otherwise similar to FIG. 1A or 2A. The optical connections depicted can, each, use one or more physical media, e.g., one or more point-to-point fiber connections.

FIG. 2B shows a star network configuration, wherein the components 11, 12, 12A are optically connected from a source component 10, e.g., a switch, hub or router, each connection passing through one or two junctions 20;

FIG. 2C illustrates a ring topology, whereby each component 10-12A optically connects to two other components, forming a single continuous pathway for signals through each node 10, 11, 12, 12a. The two junctions 20 still constrain the optical connections. Data can thus travel from node to node, with each node along the way handling the signal. As such a topology provides only one pathway between any two nodes, and thus can be disrupted by failure of a single link, a dual ring-like topology may be preferred, as known per se; and FIG. 2D shows a mesh configuration, wherein all components 10-12A of the second set are optically connected two-by-two, via one of or the two junctions 20. This is an example of fully connected optical network which maps onto the topology of the cooling conduit network (partially only, since not all conduits need be mapped). Such a connected network does not need switching or broadcasting. As the number of connections grows quadratically with the number of nodes, its application is limited to a reduced number of nodes, e.g., typically less than 20 in the present context.

Not that intermediate configurations can be contemplated between that of FIG. 2C and FIG. 2D, involving partially redundant mesh. As the costs of the star network configuration, as well as the ring and dual counter-rotating rings, scale linearly, while the mesh scales quadratically, the decision as to which configuration to choose is driven by considerations on performance, number of components, costs, etc.

In each of the cases of FIGS. 2B-C, node 10 can be configured to provide switching/routing functions (although not required in the case of FIG. 2D). Such a configuration is particularly advantageous in the star topology, FIG. 2B, which minimizes both the number of fibers and the communication latency between nodes 11, 12 and 12a. Such a configuration therefore mitigates or even circumvents the need for placing optical devices such as splitters inside or in the vicinity of conduit junctions, with multiple in/out sections. The optical/electrical switching hub 10 is in that case a leaf/terminal node as any other component 11, 12, 12a (e.g., CPU, GPU, IO Bridge, and DRAM). This makes the star topology especially attractive for high performance systems that can afford the cost of a switch. Other applications can preferably use rings or meshes, provided that the nodes have sufficient IO ports.

In embodiments, all IOs can be conveyed through the same hybrid conduits as described above, including networking functions (Ethernet, InfiniBand, PCIe, HT, Lightning/Thunderbolt, USB, IEEE 1394 serial bus interface standard, etc.), such conduits connecting not just the blade-level chips, but also the chassis and the rack boards together.

The actual optical channel implementation (single fiber strands, bundles floating freely within the cooling fluid, or ribbons, flat or curved, etc.) shall notably depend on the costs of components and fabrication methods retained.

Figure 3:
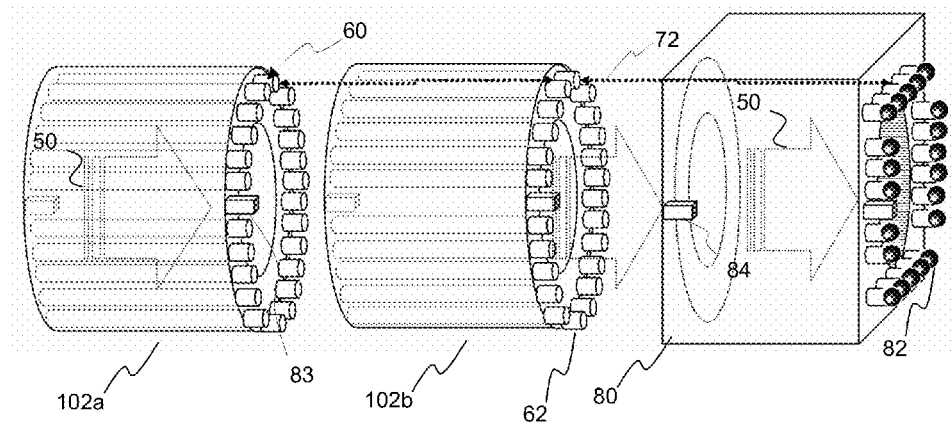
FIG. 3 is a 3D view of a simplified representation of cooling conduit parts and a transmission medium-to-optical receivers adapter, wherein a first conduit part connects to the second conduit part, which itself connects to the adapter on one side thereof, as involved in embodiments.

Referring now to FIGS. 3-4: the electronic circuit device can further be an adapter 80, paired to a given conduit or conduit part 102b of the conduit network. This adapter 80 optically couples optical transmission medium 60 (integral with the conduit part 102b) to optical receivers 11t (here assumed to be transceivers or transmitter-receivers), which are located on or in a component 11. The latter is here assumed to be a 3D chip (known per se). The adapter 80 can include suitable optical elements 82 such as lenses or microlenses, each arranged to collect optical signal (conveyed through a respective optical path 72 in the optical medium 60) and re-direct optical signal 70 towards one of the optical transceivers 11r of the chip 11.

In FIG. 4, the transceivers 11t are statically paired e.g., by means of optically coupling source-destination IO pairs, e.g., TX[i]→RX[i], etc., across a chip edge interface, by means of micro-lenses 82. In variants, the pairing can also be dynamic, e.g. via flipping micro-mirrors, e.g., DLP chips e.g. by Texas Instruments (not shown). Still, the pairing could be achieved by direct coupling, e.g., without lenses. Namely, optical fibers could be directly coupled to transceivers on the 3D chip 11; this step can be performed before or after mechanically coupling the conduit to the chip. In this embodiment, the cooling fluid 50 flows through the chip 11, and is collected in a further conduit (not shown) on a side of the chip 11. The chip 11 is received in a suitable housing (not shown) or otherwise configured for containing the cooling fluid 50 flowing trough it. The adapter 80 can possibly be paired to additional conduits (e.g., on other sides of the adapter 80, as in FIG. 5) to re-route the cooling flow path around the chip 11, and further distribute the cooling fluid to another location.

In variants, the component 11 can be a 2D or 2.5D chip. The conduit network can include conduits arranged on at least one side, e.g., one edge of the chip, and configured to cool elements on or in the chip 11.

In other variants, smaller conduits (not shown) can even reach directly into, i.e., be arranged partly within a 3D chip. Namely, direct access to inner parts of a 3D-stacked package 11 by the cooling fluid is possible using e.g., capillaries or thin tubes. By re-using the cooling 'plumbing' infrastructure, one can insert a potentially large number of fiber channels, thus scaling the future IO capacity beyond the realm of TBps. A limitation of the embodiment of FIG. 4 is estimated to be in the practical density of the chip/package 'edge' interface. This arguably is limited by the tube-to-chip adaptation system 80. However, the size of the optical assembly of lenses (or similar means) required for pairing optical transceivers 11t of the chip stack 11 to those in the cooling tube can not substantially reduce the benefits of this embodiment. In still other variants (not depicted here), the tube-to-chip interface is not done at the shown edge with direct optical coupling to receivers, but via multiple flex sheets, e.g., one or more flex sheets provided for each chip in the stack.

Figure 5:
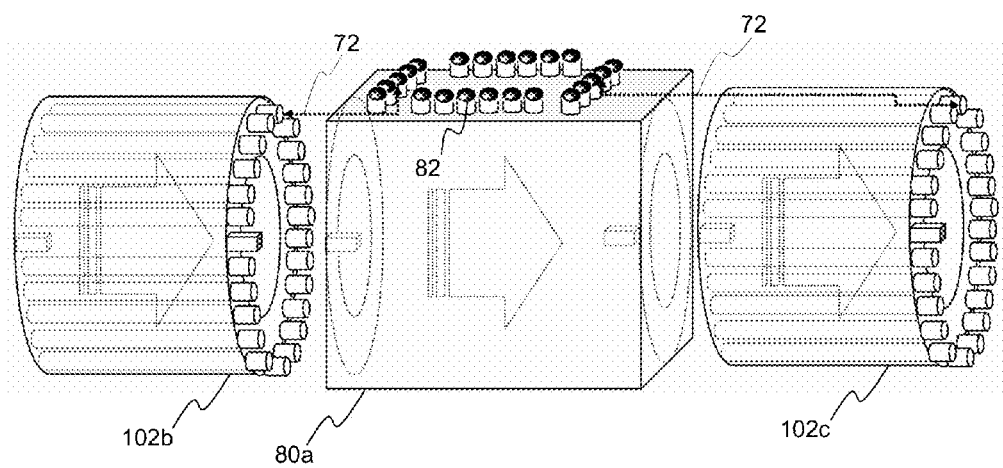
FIG. 5 is a 3D view of a simplified representation of a variant to FIG. 3, wherein the adapter connects to two conduit parts on opposite sides, as involved in embodiments.
Figure 6:
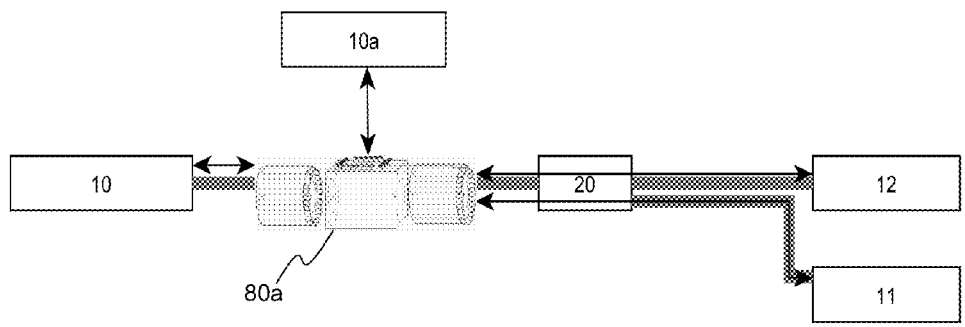
FIG. 6 is a simplified representation of a variant to FIG. 2A, wherein an adapter is inserted between two cooling conduit parts, as in FIG. 5, upstream a junction in a tree-like cooling conduit network, to enable optical connection to an additional component, as involved in embodiments.

FIG. 5 is a variant to FIG. 3, wherein the adapter 80a now connects two conduit parts 102b, 102c, on distinct sides of the adapter 80a (essentially a cuboid). The connected sides of the adapter 80a need not be opposite sides. Thus, such an adapter 80a can be useful to re-route cooling fluid. Building on this concept, variants to the adapter 80a can connect three conduit parts (or more), such as to provide a junction, at which a component can be optically coupled to inject/collect signal. This variant of the adapter 80a can thus be used in place of a junction 20. In addition, the adapter 80a can include a liquid outlet (not shown), to dispense cooling liquid to a 3D chip as in FIGS. 3-4. The adapter 80a (and variants thereof) are particularly useful in a configuration such as depicted in FIG. 6, wherein an adapter is inserted between two cooling conduit parts, as in FIG. 5, and placed upstream a junction 20, in a tree-like topology similar to FIG. 2A. The configuration 102b-80a-102c of FIG. 5 enables optical connection to an additional component 10a, e.g., an optical switch, upstream a junction 20. The configuration 102b-80a-102c is furthermore useful for single-loop conduits as depicted in FIG. 1B, where it allows for coupling components to optical medium in conduits (in/out). Note that instead of lenses, the adapters 80, 80a can involve direct coupling. More generally, adapters 80, 80a (and variants) enable in/out connections of optical medium 60 at any point in the hybrid network 100.

Figure 9:
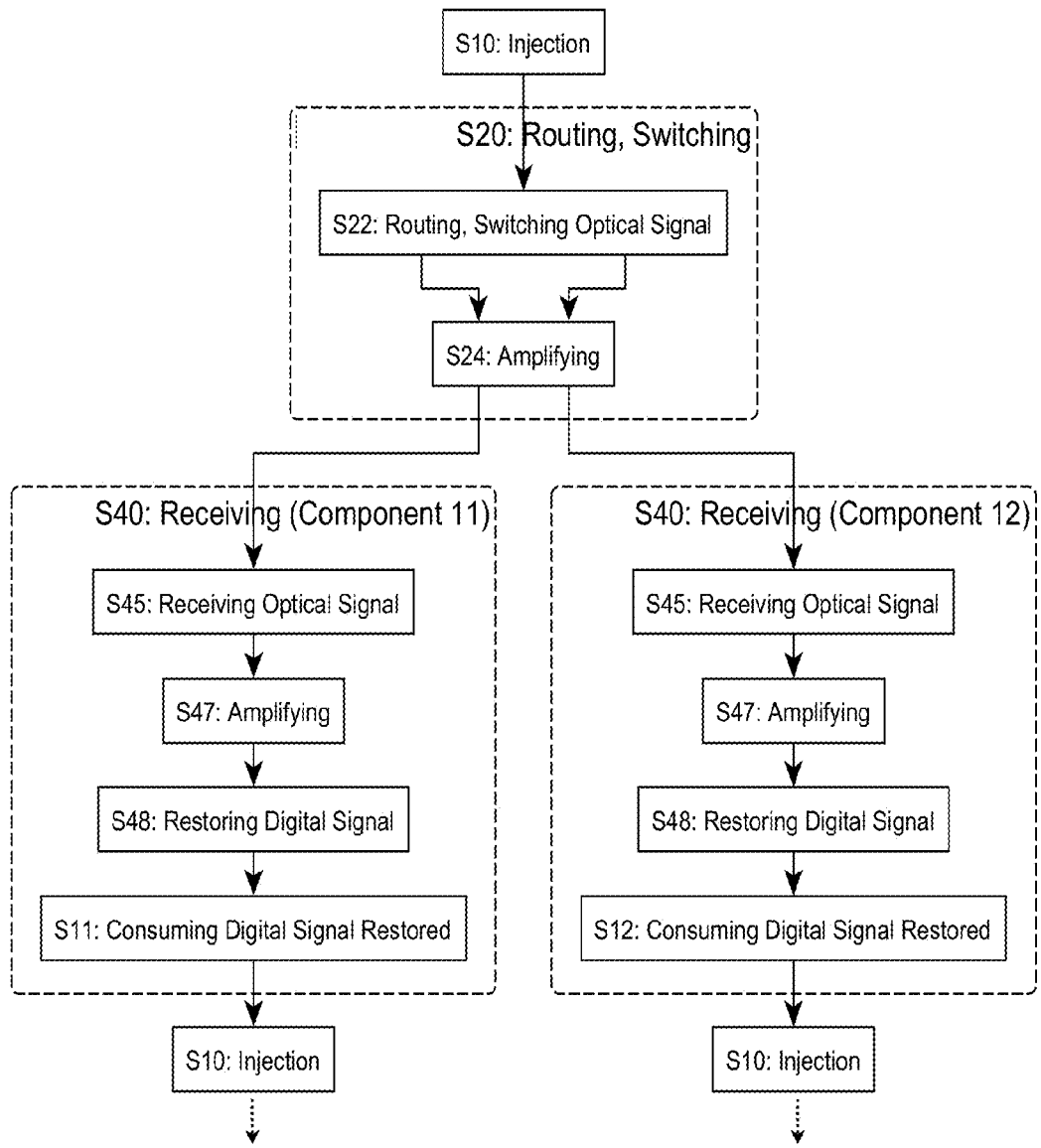
FIG. 9 is a flowchart illustrating high-level steps of a method for conveying optical signal in an electronic circuit device, according to embodiments.

Next, according to another aspect, the invention can be embodied as a method for conveying optical signal in an electronic circuit device such as described above. Referring more particularly to FIG. 9, the method includes:

Step S10: injecting optical signal 70 in optical transmission medium 60 of conduits to convey data, e.g., IO channels, optically in the hybrid network 100; and Step S60: collecting optical signal conveyed in the optical transmission medium. As already discussed earlier, signal injected can come from a given component 10-12a of the combined network 100 (or any external component), whereas the collected signal is typically converted for distribution to one or more other components 10-12a of the network 100.

More in detail, and as evoked earlier in reference to FIG. 2A, various additional steps can be involved, such as routing, splitting, or switching (step S20) optical signal in the transmission medium 60 to convey optical signal to, from or between components 10-12a of the second set. Similarly, signal could be added or dropped. Amplification of the optical signal may be needed (steps S24, S47). Amplification is typically carried out after injecting S10, collecting S40 and/or routing, splitting, or switching S20 the optical signal, as discussed earlier.

Preferably, fast optical switches are relied upon, such as electro-optic or magneto-optic elements or semiconductor optical amplifiers, to perform the logic operations. All operations needed in the present context are independently known per se, e.g., in the field of optical switches. The logic needed to properly route optical signals in the present context is known from e.g., silicon photonics.

Integrated circuit devices 1, 1s as described above can typically be distributed by the fabricator in a packaged form, i.e., a chip is mounted in a single chip package (such as a plastic carrier, with leads that are affixed to a motherboard or other higher level carrier) or in a multichip package (such as a ceramic carrier that has either or both surface interconnections or buried interconnections). In any case the chip can then be integrated with other chips, discrete circuit elements, and/or other signal processing devices as part of either (a) an intermediate product, such as a motherboard, or (b) an end product. The end product can be any product that includes integrated circuit chips, ranging from low-end applications to advanced computer products.

The above embodiments have been succinctly described in reference to the accompanying drawings and can accommodate a number of variants. Several combinations of the above features can be contemplated. Examples are given in the next section.

In particularly referred embodiments, data-carrying optical fibers are inserted or clad the inner (or outer) water-cooling pipelines, such as to connect components that include a 3D chip. The water flow is minimally disturbed by (i) the reduction in cross-section, (ii) fiber's protective layers, (iii)

joints, and (iv) fiber to 3D-stacked chip IO pad fanout. One or more IO channels are injected into/extracted from optical fibers, by means of optical transceivers/photodiodes/etc., which are statically paired, e.g., across the edge interface of chips, preferably by means of micro-lenses. The IO data are optically conveyed along the fiber-clad pipelines, logically organized as data-/address-/ . . . -busses.

The fiber cladding typically has a diameter of 125 µm, while cooling tubes range from 2 to 15 mm. Typical diameters for multimodal optical fibers are 50 µm or 65.2 µm for the core and 125 µm for the cladding. Alternatively, fiber flat band arrays or flex sheets are used, as discussed earlier.

The flowchart and block diagrams in the figures illustrate the architecture, functionality, and operation of possible implementations of devices, systems, and methods according to various embodiments of the present invention. As noted earlier, in some alternative implementations the components in FIGS. 1, 2 and 6 can occur in a different arrangement. Similarly, the steps in the flowchart of FIG. 9 can occur in a different order. Some of the steps can be grouped in broader functional steps, etc.

In embodiments, the electronic circuit device can include one or more of the following features:
the optical transmission medium is arranged within the conduit, and, preferably:
at least part of the optical transmission medium freely extends within the at least one conduit; and/or
at least a part of an inner wall of said at least one conduit is covered by at least a part of the optical transmission medium;
an outer wall of said at least one conduit is covered by the optical transmission medium, said at least one covered conduit being preferably within an outer conduit;
the electronic circuit device further includes:
one or more optical signal injection units configured to inject optical signal in the optical transmission medium, wherein, preferably, at least one of the signal injection units is in signal communication with one or more components of the second set; and
one or more optical receivers adapted to collect optical signal conveyed along the optical transmission medium, preferably for one or more components of the second set,
wherein, preferably, one of said optical signal injection units and one of said optical receivers form part of a transceiver element or a transmitter-receiver element;
the electronic circuit device further includes a transmission medium-to-optical receivers adapter, paired to at least one given conduit of the combined network, optically connecting optical transmission medium of said at least one given conduit with at least some of the optical receivers, wherein the adapter preferably includes optical elements such as lenses or micro-lenses, each arranged such as: to collect optical signal conveyed through an optical path in the optical transmission medium; and re-direct collected optical signal towards one of the optical receivers;
the optical signal injection unit includes both a data transmitter and a light-emitting device such as a laser device, the data transmitter coupled to the light-emitting device, which itself is coupled to optical transmission medium of a given conduit of the combined network, to enable optical signal injection therein;
at least one of the optical receivers includes: a photodetector, which preferably includes a photodiode; and a digital signal restoration unit, which preferably is coupled to an amplifier, wherein the photodetector is coupled to the digital signal restoration unit to enable digital signal restoration from optical signal conveyed in the combined network;
the combined network further includes:
an upstream conduit;
two downstream conduits, configured for the combined network to connect to at least two components of the second set, each of the upstream and downstream conduits including an optical transmission medium; and
a junction, whereat said upstream conduit splits into said two downstream conduits,
wherein the second set preferably includes an optical signal router, an optical switch, and/or an optical splitter such as a fiber splitter, coupled in the device to respectively route, switch and/or split optical signal conveyed in the optical transmission medium,
and wherein, more preferably, the second set further includes one or more of the following components:
an input/output bridge device;
a memory integrated circuit such as a DIMM; and
a processor, preferably a central processing unit.
the ratio of a cross-sectional dimension, such as a thickness, of said optical transmission medium to the inner section diameter of said at least one conduit is less than 0.13, preferably –0.07, more preferably 0.02; the cross-sectional dimension of said optical transmission medium is less than 500 micrometers, preferably less than 250 micrometers and more preferably less than 130 micrometers; and an inner section diameter of said at least one conduit is less than 20 000 micrometers, preferably less than 5 000 micrometers and more preferably less than 3 000 micrometers;
the electronic circuit device further includes an electrical input/output channel transmission medium, and a component of the second set is a dual input/output component, such as a dual input/output chip, on the one hand optically connected to the optical transmission medium and on the other hand electrically connected to said electrical input/output channel transmission medium;
a component of the second set is a 2D, 2.5D or 3D chip, and the combined network includes one or more conduits arranged on at least one side of the chip and/or within a 3D chip, and configured to cool elements of the chip;
the second set of components form a network of components connected via said combined network, a first subset of the components of the second set being in signal communication with a second subset of the components of the second set thanks to optical transmission medium of the combined network, said components of the second set arranged in:
a star network configuration, wherein components of the second set are optically connected from a source component of the second set, the source component configured as a switch, hub or router;
a ring topology or dual-ring topology, whereby each component of the second set optically connects to two other components of the second set; or
a mesh configuration, wherein all components of the second set are optically connected two-by-two;

According to another aspect, the invention is embodied as a method for conveying optical signal in an electronic circuit device as in any one of the above embodiments, wherein the method includes: injecting optical signal in optical transmission medium of said at least one conduit to convey optical signal therein; and collecting optical signal conveyed in said optical transmission medium.

Preferably, the step of injecting is carried out such as to convey input/output channels optically in the transmission medium.

The method can further include: routing, splitting, or switching optical signal in the transmission medium to convey signal to, from or between components of the second set, and preferably, method can further include amplifying optical signal, wherein, more preferably, amplifying is carried out after injecting, collecting and/or routing, splitting, or switching optical signal.

While the present invention has been described with reference to a limited number of embodiments, variants and the accompanying drawings, it will be understood by those skilled in the art that various changes can be made and equivalents can be substituted without departing from the scope of the present invention. In particular, a feature (device-like or method-like) recited in a given embodiment, variant or shown in a drawing can be combined with or replace another feature in another embodiment, variant or drawing, without departing from the scope of the present invention. Various combinations of the features described in respect of any of the above embodiments or variants can accordingly be contemplated, that remain within the scope of the appended claims. In addition, many minor modifications can be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated. For example, intermediate layers (e.g., polymer) can be involved between the optical medium 60 and a conduit wall 102$i$ or 102$o$ to facilitate the bonding of and/or protect the optical medium 60 or insulate the medium 60 from interference, etc.

What is claimed is:

1. An electronic circuit device, comprising a combined optical transmission and cooling fluid conduit network, wherein the network comprises at least one cooling conduit that comprises an optical transmission medium, wherein the network is configured to convey:
   a cooling fluid via the at least one cooling conduit, the network being in thermal communication with a first set of components of the electronic circuit device; and
   an electromagnetic signal via the optical transmission medium, the network being in thermal communication and signal communication with a second set of one or more components of the electronic circuit device, wherein the first set and second set of components at least partly overlap.

2. The electronic circuit device of claim 1, wherein the optical transmission medium is arranged within the conduit, and wherein: at least part of the optical transmission medium freely extends within the at least one conduit; and/or at least a part of an inner wall of the at least one conduit is covered by at least a part of the optical transmission medium.

3. The electronic circuit device of claim 1, wherein: an outer wall of the at least one conduit is covered by the optical transmission medium; and the at least one covered conduit is within an outer conduit.

4. The electronic circuit device of claim 1, wherein the electronic circuit device further comprises: one or more optical signal injection units configured to inject optical signal in the optical transmission medium, wherein at least one of the signal injection units is in signal communication with one or more components of the second set; and one or more optical receivers adapted to collect optical signal conveyed along the optical transmission medium for one or more components of the second set.

5. The electronic circuit device of claim 4, wherein, one of the one or more optical signal injection units and one of the one or more optical receivers form part of a transceiver element or a transmitter-receiver element.

6. The electronic circuit device of claim 4, wherein: the electronic circuit device further comprises a transmission medium-to-optical receivers adapter, paired to at least one given conduit of the combined network, optically connecting optical transmission medium of the at least one given conduit with at least one of the optical receivers.

7. The electronic circuit device of claim 6, wherein the adapter comprises optical elements, each arranged (i) to collect optical signal conveyed through an optical path in the optical transmission medium and (ii) to re-direct collected optical signal towards one of the optical receivers.

8. The electronic circuit device of claim 4, wherein: the optical signal injection unit comprises both a data transmitter and a light-emitting device; and the data transmitter is coupled to the light-emitting device, which itself is coupled to optical transmission medium of a given conduit of the combined network to enable optical signal injection therein.

9. The electronic circuit device of claim 4, wherein at least one of the one or more optical receivers comprises a photodetector and a digital signal restoration unit; wherein the photodetector is coupled to the digital signal restoration unit to enable digital signal restoration from optical signal conveyed in the combined network.

10. The electronic circuit device of claim 1, wherein the combined network further comprises: an upstream conduit; two downstream conduits configured for the combined network to connect to at least two components of the second set; and a junction; wherein the upstream conduit splits at the junction into the two downstream conduits; and wherein each of the upstream and downstream conduits comprises an optical transmission medium.

11. The electronic circuit device of claim 10, wherein the second set comprises at least one component selected from the group consisting of: an optical signal router, coupled in the device to route the optical signal conveyed in the optical transmission medium; an optical switch, coupled in the device to switch the optical signal conveyed in the optical transmission medium; an optical splitter, coupled in the device to split the optical signal conveyed in the optical transmission medium; an input/output (TO) bridge device; a memory integrated circuit; and a processor.

12. The electronic circuit device of claim 1, wherein: the ratio of a cross-sectional dimension of the optical transmission medium to the inner section diameter of the at least one conduit is less than 0.13; the cross-sectional dimension of the optical transmission medium is no more than 500 micrometers; and an inner section diameter of the at least one conduit is no more than 20,000 micrometers.

13. The electronic circuit device of claim 1, further comprises an electrical input/output channel transmission medium, wherein a component of the second set is a dual input/output component optically connected to the optical transmission medium and electrically connected to the electrical input/output channel transmission medium.

14. The electronic circuit device of claim 1, wherein: a component of the second set is a 2D, 2.5D or 3D chip; the combined network comprises one or more conduits; and the one or more conduits are configured to cool elements of the chip.

15. The electronic circuit device of claim 14, wherein the one or more conduits are arranged on at least one side of the chip and/or within a 3D chip.

16. The electronic circuit device of claim 1, wherein: the second set of components form a network of components connected via the combined network; and a first subset of the components of the second set are in signal communication with a second subset of the components of the second set resulting from the optical transmission medium of the combined network; wherein the components of the second set are arranged in: a star network configuration, wherein components of the second set are optically connected from a source component of the second set, the source component being configured as a switch, hub or router; a ring topology or dual-ring topology, wherein each component of the second set optically connects to two other components of the second set; or a mesh configuration, wherein all components of the second set are optically connected two-by-two.

\* \* \* \* \*